(12) United States Patent
Otwinowski et al.

(10) Patent No.: US 12,073,541 B2
(45) Date of Patent: Aug. 27, 2024

(54) METHODS FOR HIGH-PERFORMANCE ELECTRON MICROSCOPY

(71) Applicant: THE BOARD OF REGENTS OF THE UNIVERSITY OF TEXAS SYSTEM, Austin, TX (US)

(72) Inventors: Zbyszek Otwinowski, Dallas, TX (US); Raquel Bromberg, Dallas, TX (US); Dominika Borek, Dallas, TX (US)

(73) Assignee: THE BOARD OF REGENTS OF THE UNIVERSITY OF TEXAS SYSTEM, Austin, TX (US)

( * ) Notice: Subject to any disclaimer, the term of this patent is extended or adjusted under 35 U.S.C. 154(b) by 365 days.

(21) Appl. No.: 17/633,133

(22) PCT Filed: Aug. 10, 2020

(86) PCT No.: PCT/US2020/045673
§ 371 (c)(1),
(2) Date: Feb. 4, 2022

(87) PCT Pub. No.: WO2021/030297
PCT Pub. Date: Feb. 18, 2021

(65) Prior Publication Data
US 2022/0277427 A1    Sep. 1, 2022

Related U.S. Application Data

(60) Provisional application No. 62/885,154, filed on Aug. 9, 2019.

(51) Int. Cl.
G06T 5/80        (2024.01)
H01J 37/22       (2006.01)

(52) U.S. Cl.
CPC .............. *G06T 5/80* (2024.01); *H01J 37/222* (2013.01); *G06T 2207/10061* (2013.01); *H01J 2237/223* (2013.01); *H01J 2237/2826* (2013.01)

(58) Field of Classification Search
None
See application file for complete search history.

(56) References Cited

U.S. PATENT DOCUMENTS 6,750,451 B2 *   6/2004   Koguchi .............. H01J 37/2955
                                                      250/311
9,297,737 B2 *   3/2016   Trainer .............. G01N 15/0211
(Continued)

FOREIGN PATENT DOCUMENTS

WO    2016014177 A1    1/2016

OTHER PUBLICATIONS

International Search Report and Written Opinion for International application No. PCT/US2020/045673, mailed Oct. 28, 2020, 7 pages.

(Continued)

Primary Examiner — Ian L Lemieux
(74) Attorney, Agent, or Firm — Polsinelli PC

(57) ABSTRACT

Methods for correcting one or more image aberrations in an electron microscopy image, including cryo-EM images, are provided. The method includes obtaining a plurality of electron microscope (EM) images of an internal reference grid sample having one or more known properties, the plurality of electron microscope images obtained for a plurality of optical conditions and for a plurality of coordinated beam-image shifts. The method may also include, among other features, determining an aberration correction (Continued)

function that predicts aberrations for every point in the imaged area using kernel canonical correlation analysis (KCCA).

15 Claims, 7 Drawing Sheets

(56) References Cited

U.S. PATENT DOCUMENTS

| | | | | |
|---|---|---|---|---|
| 9,711,323 | B2* | 7/2017 | Sintorn | H01J 37/153 |
| 9,754,774 | B2* | 9/2017 | Bazargan | H01J 49/105 |
| 9,928,989 | B2* | 3/2018 | Sintorn | H01J 37/153 |
| 10,332,719 | B2 | 6/2019 | Morishita | |
| 2004/0197017 | A1* | 10/2004 | Olschewski | G06T 7/0012 |
| | | | | 382/128 |
| 2013/0266240 | A1 | 10/2013 | Rieger et al. | |
| 2016/0266366 | A1 | 9/2016 | Chung et al. | |
| 2017/0178325 | A1 | 6/2017 | Ye et al. | |
| 2018/0306698 | A1* | 10/2018 | Kasdan | G01N 15/1459 |

OTHER PUBLICATIONS

Henderson R (1995) The potential and limitations of neutrons, electrons and X-rays for atomic resolution microscopy of unstained biological molecules. Q Rev Biophys 28(2):171-193.
Wang HW, et al. (2017) How cryo-electron microscopy and X-ray crystallography complement each other. Protein Sci 26(1):32-39.
Fan X, et al. (2019) Single particle cryo-EM reconstruction of 52 kDa streptavidin at 3.2 Angstrom resolution. Nat Commun 10(1):2386.
Bromberg R, et al. (2019) High-resolution cryo-EM reconstructions in the presence of substantial aberrations. bioRxiv:798280.
Cheng A, et al. (2018) High resolution single particle cryo-electron microscopy using beam-image shift. J Struct Biol 204(2):270-275.
Mastronarde DN (2005) Automated electron microscope tomography using robust prediction of specimen movements. J Struct Biol 152(1):36-51.
Zivanov J, et al. (2018) New tools for automated high-resolution cryo-EM structure determination in RELION-3. Elife 7.
Zivanov J, et al. (2019) Estimation of High-Order Aberrations and Anisotropic Magnification from Cryo-EM Datasets in RELION-3.1. bioRxiv:798066.
Zemlin F, et al. (1978) Coma-Free Alignment of High-Resolution Electron-Microscopes with Aid of Optical Diffractograms. Ultramicroscopy 3(1):49-60.
Glaeser RM, et al. (2011) Precise beam-tilt alignment and collimation are required to minimize the phase error associated with coma in high-resolution cryo-EM. Journal of Structural Biology 174(1):1-10.
Li K, et al. (2019) Sub-3A apoferritin structure determined with full range of phase shifts using a single position of volta phase plate. J Struct Biol 206(2):225-232.
Extended European Search Report for EP Application No. 20853457.8 mailed Aug. 2, 2023 (Applicant—The Board of Regents of the University of Texas System) (10 Pages).
Zhang Kai Ed—Hanein Dorit et al: "Gctf: Real-time CTF determination and correction", Journal of Structural Biology, Academic Press, United States, vol. 193, No. 1, Nov. 19, 2015 (Nov. 19, 2015), pp. 1-12, XP0293691 62, ISSN: 1047-8477, DOI: 10.1016/J.JSB. 2015.11.003.
Rohou Alexis et al: "CTFFIND4: Fast and accurate defocus estimation from electron micrographs", Journal of Structural Biology, Academic Press, United States, vol. 192, No. 2, Aug. 13, 2015 (Aug. 13, 2015), pp. 216-221, XP029293557, ISSN: 1047-8477, DOI: 10.1016/J.JSB.2015.08.008.
Herzik Mark A et al: "A Multi-model Approach to Assessing Local and Global Cryo-EM Map Quality", Structure, vol. 27, No. 2 , p. 344, XP085591 869, ISSN: 0969-2126, DOI: 10.1016/J.STR.2018. 10.003.
Chen, Xiao-Xuan, and Fan, Zhi-Gang: "Point Spread Function Estimation based on Wavelet Transform forImage Restoration", SPIE, PO Box 10 Bellingham WA 98227-0010 USA, Nov. 29, 2007 (Nov. 29, 2007), XP040249947.

* cited by examiner

METHODS FOR HIGH-PERFORMANCE ELECTRON MICROSCOPY

CROSS-REFERENCE TO RELATED APPLICATIONS

This application is a national stage entry of PCT/US2020/045673 filed Aug. 10, 2020, which claims the benefit of priority to U.S. Provisional Application Ser. No. 62/885,154 filed Aug. 9, 2019, the entire contents of which are hereby incorporated by reference, for all purposes.

ACKNOWLEDGEMENT OF GOVERNMENT SUPPORT

This invention was made with government support under Grant Numbers GM117080 and GM118619 awarded by the National Institutes of Health. The government has certain rights in the invention.

BACKGROUND

1. Field

The present inventive concept is directed to methods for correcting image aberrations in electron microscopy.

2. Discussion of Related Art

The electron microscope is a unique device in that it can image nanoscale biological objects in detail. Imaging by electron microscopy can be followed by determination of the three-dimensional structures of analyzed objects, down to the atomic level, without the need for a highly organized form of molecular matter, e.g. crystals or fibers, which are required in other methods of structural biology providing high resolution structures of biological matter. However, the success and the quality of three-dimensional structure determination is affected by the microscope's imaging properties which are technically described by a combination of image distortion, defocusing and image aberrations, including intentionally introduced effects from a phase plate. While some effects are introduced intentionally, for example, defocus or phase plate charging, other aberrations are preferentially minimized, although this is not required if these aberrations are precisely calibrated and corrected during the image analysis and structure determination.

Minimization of aberrations is achieved by applying a complex procedure, called microscope alignment, which is not yet fully automated. Inherent to electron microscopy alignment is that these aberration- and distortion-minimized imaging properties are achieved only over a small area, so observing a different part of the sample requires repetitive, mechanical translation, which is a serious impediment to efficient data collection in cryo-EM single particle reconstruction or analysis (SPA or SPR). Currently, the use of the SPA method is rapidly expanding and the total investment in SPA-related hardware is on the order of 1 billion dollars. Therefore, additional techniques and methods for correcting or minimizing image aberrations in electron microscopy are desired.

BRIEF SUMMARY

The following brief description is provided to indicate the nature of the subject matter disclosed herein. While certain aspects of the present inventive concept are described below, the summary is not intended to limit the scope of the present inventive concept.

The presently disclosed methods, systems, and apparatuses provide for complex patterns of distortions and aberrations to be described, calibrated, and reversed during computational data analysis following data acquisition in electron microscopy (EM), including cryo-EM. In particular, the presently disclosed methods provide (1) more detailed, e.g., higher resolution results; (2) much more efficient data collection, so that one instrument can have a many-fold improvement in data collection throughput; (3) elimination of the high level of expertise or frustration from less experienced users with respect to microscope alignment; and (4) enabling more informative data collection modes involving phase plate and beam tilt.

According to one aspect of the present disclosure, methods, systems and apparatuses are provided for correcting EM image aberrations, especially correcting non-axial aberrations using: an experimentally obtained calibration (map) of local changes of axial aberrations and analysis with kernel canonical correlation done on these local changes to recover a global description of non-axial aberrations (predictor). The global predictor then can be applied to obtain patterns of aberrations in any position away from the optical axis and eucentric height to navigate image space at distances far from optical axis without impact of aberrations on data quality. While it is often desirable to calibrate the full xy range of available beam-image shift, the full available range of z translations does not need to be calibrated.

According to at least one aspect of the present disclosure, a method for correcting one or more image aberrations in an electron microscopy image is provided. The method may include: (a) obtaining a plurality of electron microscope (EM) images of an internal reference grid sample having one or more known properties, the plurality of electron microscope images obtained for a plurality of optical conditions and for a plurality of coordinated beam-image shifts, wherein the plurality of optical conditions is selected from a plurality of defocuses, a plurality of z-heights, a plurality of beam tilts, and any combination thereof; (b) correcting the plurality of EM images for sample drift by aligning and motion-correcting the plurality of EM images to produce an EM micrograph; (c) calculating the Fourier transform (FT) of the micrograph to produce an FT image; (d) deconvolving the FT image using a predetermined deconvolution coefficients selected from a range of deconvolution coefficients values to produce a deconvolved FT image; (e) applying a high-pass filter to the deconvolved FT image to remove all frequencies lower than $\frac{1}{500}$ Å to produce a filtered deconvolved FT image; (f) calculating an inverse FT of the filtered deconvolved FT image to produce an aberration-corrected EM micrograph; (g) determining an intensity distribution for the aberration-corrected EM micrograph; (h) calculating a moment for the intensity distribution; and (i) repeating (c)-(h) using a predetermined deconvolution coefficients selected from the range of deconvolution coefficients values that is different than the previous iteration until optimal deconvolution coefficients are determined based on maximization of the moment in (i).

The method may further include (j) determining an aberration correction function that predicts axial aberrations for every point in the imaged area using kernel canonical correlation analysis (KCCA) of the optimal deconvolution coefficients obtained in (i) and the plurality of optical conditions and plurality of coordinated beam-image shifts used in (a). The method may also include: (k) obtaining one or more EM images of a calibration check grid sample having one or more known properties that is different than at least one of the one or more known properties of the internal reference grid sample; (l) applying the aberration correction function to the one or more EM images obtained in (k) to produce an aberration corrected EM image; and (m) determining suitability of the aberration correction function based on comparison of one or more features in the aberration corrected EM image corresponding to one or more known properties of the calibration check grid sample.

According to another aspect of the present disclosure, a method for correcting geometrical distortion in an electron microscopy image is provided. The method may include: (a) obtaining a plurality of electron microscope (EM) images of an internal reference grid sample having one or more known properties, the plurality of electron microscope images obtained for a plurality of optical conditions and for a plurality of coordinated beam-image shifts, wherein the plurality of optical conditions is selected from a plurality of defocuses, a plurality of z-heights, a plurality of beam tilts, and any combination thereof; wherein the internal reference grid sample comprises an amorphous material distributed over a crystalline support having known unit cell dimensions, the amorphous material comprising a thickness of five or fewer atomic layers; (b) correcting the plurality of EM images for sample drift by aligning and motion-correcting the plurality of EM images to produce an EM micrograph; (c) calculating the Fourier transform (FT) of the micrograph to produce an FT image; (d) identifying diffraction peaks on the FT image corresponding to the crystalline lattice of the internal reference grid sample; (e) performing dual space filtering on the FT image by masking the identified diffraction peaks thereby keeping only the diffraction peaks and their corresponding intensities while discarding all information between the diffraction peaks to produce a filtered FT image; (f) calculating an inverse FT of the filtered FT image to produce a filtered EM micrograph; (g) selecting a portion of the filtered EM micrograph, calculating a FT image corresponding to the portion to produce a FT sub-image, identifying a subgroup of diffraction peaks on the FT sub-image, indexing diffraction maxima for the subgroup of diffraction peaks, and determining unit cell parameters for the subgroup of diffraction peaks; (h) determining, using a deformation matrix, whether the one or more unit cell parameters determined in (g) are consistent with the known unit cell dimensions of the crystalline support of the internal reference grid sample; and (i) calculating a metric tensor based on the deformation matrix.

The method may further include (j) determining an aberration correction function that predicts the geometric distortion for every point in the imaged area using kernel canonical correlation analysis (KCCA) of the metric tensor obtained in (i) and the plurality of optical conditions used in (a). The method may also include (k) obtaining one or more EM images of a calibration check grid sample having one or more known properties that is different than at least one of the one or more known properties of the internal reference grid sample; (l) applying the aberration correction function to the one or more EM images obtained in (l) to produce an aberration corrected EM image; and (m) determining suitability of the aberration correction function based on comparison of one or more features in the aberration corrected EM image corresponding to one or more known properties of the calibration check grid sample.

BRIEF DESCRIPTION OF THE DRAWINGS

The description will be more fully understood with reference to the following figures and data graphs, which are presented as various embodiments of the present inventive concept and should not be construed as a complete recitation of the scope of the present inventive concept, wherein.

DETAILED DESCRIPTION

Figure 1:
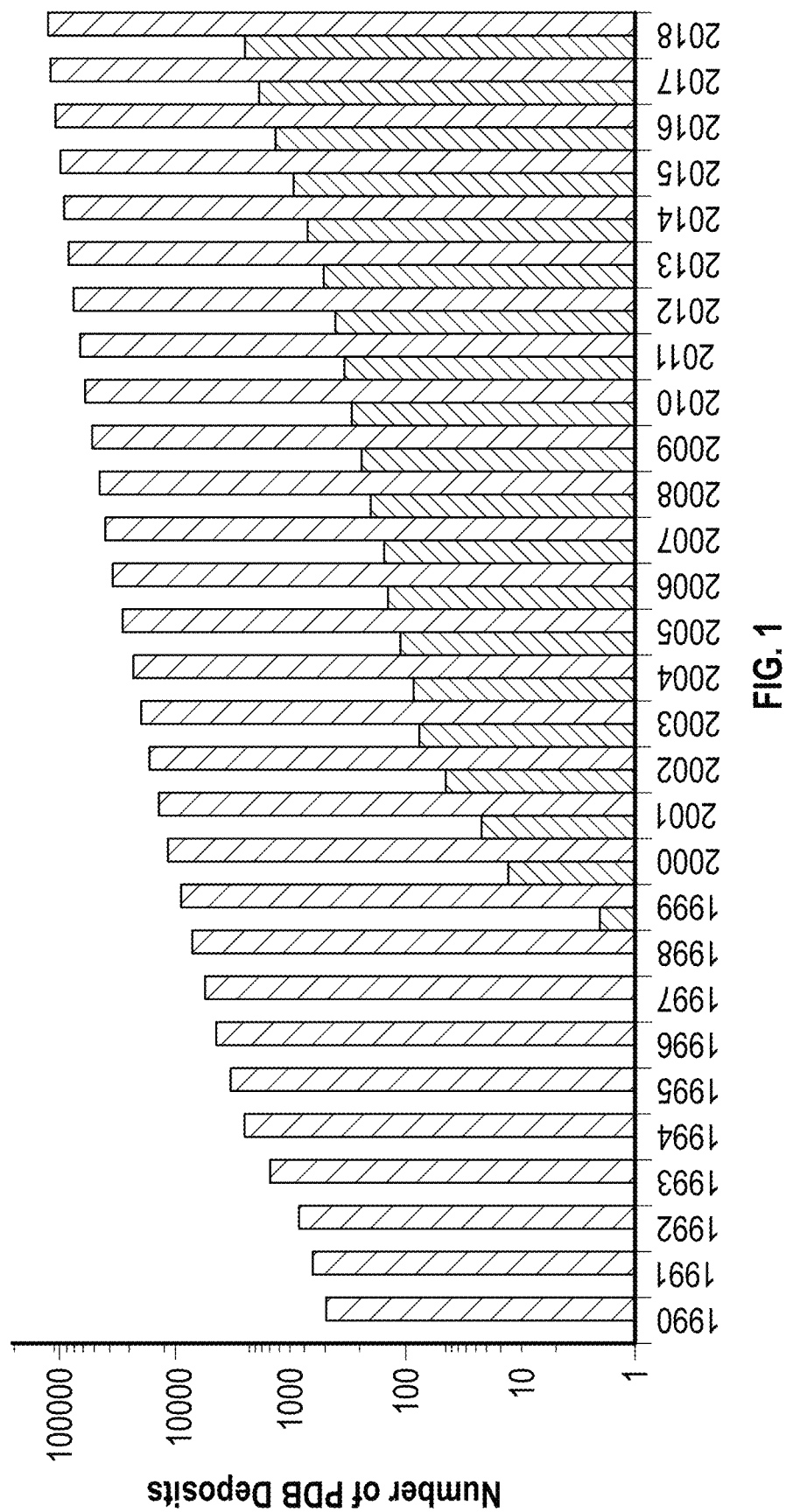
FIG. 1 depicts Protein Data Bank (PDB) cumulative statistics showing the growth of X-ray (hatched) and cryo-EM deposits (double-hatched), in accordance with an embodiment of the present inventive concept.

The present inventive concept may be understood by reference to the following detailed description, taken in conjunction with the drawings as described herein. It is noted that, for purposes of illustrative clarity, certain elements in various drawings may not be drawn to scale.

The present disclosure provides methods for methods for correcting one or more image aberrations in an electron microscopy image. The method may include obtaining a plurality of electron microscope (EM) images of an internal reference grid sample having one or more known properties under a plurality of optical conditions and at a plurality of coordinated beam-image shifts. The plurality of optical conditions may include, for example, defocuses, a plurality of z-heights, a plurality of beam tilts, and any combination thereof. The one or more known properties of the internal reference grid sample may be, for example, atomicity of the layer and/or unit cell dimensions of the grid support. As used herein, the term "atomicity" refers to materials in which the molecules are single molecules and separated from other molecules, e.g., they are not deposited in the form of clusters or aggregates.

The internal reference grid sample may include a solid support and an amorphous material distributed over the solid support. In at least some instances, the solid support may be a crystalline support having known unit cell dimensions. In such instances, the crystalline support may, for example, be made of graphene, graphene oxide, silicon, or silicon nitride. However, in the case of the use of crystalline supports, any solid support that generates a diffraction pattern with defined unit cell parameters may be used, especially those materials capable of forming a thin support structure operable to receive an amorphous coating having properties suitable for use as an internal reference grid sample according to the presently disclosed methods.

The amorphous material distributed over the solid support may have a thickness of five or fewer atomic layers. Preferably, the amorphous material has a thickness of one atomic layer, or one to three atomic layers. In at least some instances, the amorphous material comprises a metal. In such cases, the metal may be any metal that is heavy enough that it may be sputtered onto the surface of the solid support and the layer thickness may be controlled by current and vacuum. In at least some instances, the amorphous material may be, for example, gold, platinum, iridium, palladium, and any combination thereof. These metals are suitable due to their weight and relative inactivity (e.g., do not oxidize).

The plurality of coordinated beam-image shifts may be collected using a beam-image shift method. The beam-image shift method involves keeping the position of the sample constant and only shifting the position of the beam and the image so that different parts of the sample (e.g., grid) are illuminated (beam shift) and are imaged (image shift). Shifted positions of the beam and the image induce aberrations of different order. Two sets of lenses are used in the EM instrument for executing the beam-image shift method. Condenser lenses move the beam while objective lenses direct the image on the detector. Both sets of lenses are controlled electronically. In at least one embodiment, the beam-image shift is coordinated or synchronized in which the beam is shifted using coils and that shift of the beam is accompanied by a coordinated shift of the image using coils. In other instances, the desynchronized beam-image shift may be used in which either the beam or image may be moved without moving its "partner." Desynchronized beam-image shift is done to establish how parallel the beam is because the degree to which the beam is parallel affects aberrations. In at least some instances, an electron microscope (EM) image is an exposure to an electron beam that takes a few to a few tens of seconds and is acquired without changing the image position, but contains many shorter exposures (frames). In at least some instances, the plurality of EM images may be obtained at a plurality of magnifications. In some cases, the plurality of EM images may be obtained without changing the grid sample position. In at least some instances, incomplete factorial design may be used to select points for data collection and parameters for changing the optical setting of the microscope.

The presently disclosed methods for correcting one or more image aberrations in an electron microscopy image may further include correcting the plurality of EM images for sample drift by aligning and motion-correcting the plurality of EM images to produce an EM micrograph. As used herein, the term "micrograph" may refer to an entire image or parts of an image, e.g., sub images of an image. The Fourier transform (FT) of the micrograph may then be calculated to produce an FT image. The FT image contains the information of the micrograph but in reciprocal space. The FT image is affected by aberrations of an unknown type and unknown magnitude to the same extent as a real image, because FT does not change information content. However, operating in Fourier space (reciprocal space) has a mathematical advantage, because the convolution theorem states that a convolution in real space becomes a multiplication in reciprocal (Fourier) space.

The FT image is then deconvolved using a predetermined deconvolution coefficient selected from a range of deconvolution coefficients values to produce a deconvolved FT image. The Fourier representation of the micrograph involves complex numbers, which have amplitude and phase. Therefore, for micrographs affected by aberrations, amplitudes and phases will be products of FT of aberrations and FT of the image. Deconvolution of these phase and amplitude products involves phase factor multiplication (phase addition) and amplitude multiplication. The phase factor multiplying component is a complex conjugate, derived from a phase change representation of the aberration. The amplitude changing component is derived from two considerations: (1) inverse of amplitude changes of the aberration and noise optimization of the result, which creates a Wiener filter contribution. The predetermined deconvolution coefficient is a "guess" as to the value of the aberration selected from a range of possible deconvolution coefficient values representing the range of possible aberrations. Therefore, the predetermined deconvolution coefficient is an initial deconvolution coefficient value that describe the magnitude of aberrations into phase and amplitude products arbitrarily during the initializing procedure. As described below, deconvolution coefficients will be optimized in later cycles of computations.

A high-pass filter is then applied to the deconvolved FT image to remove all frequencies lower than a certain value in order to produce a filtered deconvolved FT image. For example, the high-pass filter may remove all frequencies lower than $1/500$ Å or lower than $1/50$ Å. The high-pass filter removes very low-resolution image information because such information does not represent the atomic information used in the optimization process.

The method may further include calculating an inverse FT of the filtered deconvolved FT image to produce an aberration-corrected EM micrograph. Therefore, the aberration-corrected EM micrograph is an image that corresponds to the real space image of the starting micrograph but having applied corrections for aberrations. Next, an intensity distribution is determined for the aberration-corrected EM micrograph. For example, a histogram of all intensity values in the aberration-corrected image (millions of pixels) may be generated. The histogram will have a shape that is non-Gaussian, with a tail towards more positive values. The non-Gaussian distribution results from the grid properties, e.g., a thin layer of metal atoms. These atoms, if the image is fully corrected, should be "brighter" and there also may be empty spaces between them. Both features cause the intensity histogram to be non-Gaussian. Non-Gaussianity results from "unevenness" of some features of the distribution, for example, the intensity signal feature resulting from sparsely sputtered metal on the grid support. Aberrations distort that signal and consequently make the image of the grid sample more "even" in terms of intensity distribution.

The method further includes calculating a moment for the intensity distribution. Moments describe quantitatively the shape of the distribution. A specific moment is selected from a range of options, for example, skewness, kurtosis, negative entropy, or any other function that is suitable for independent component analysis (ICA). Any function capable of being used by ICA may be suitable for the presently disclosed techniques and methods. In at least some instances, calculating the moment includes quantifying the shape of the intensity distribution based on optimizing negative entropy.

The method further includes repeating the FT calculation, deconvolving the FT image, applying the high-pass filter, calculating the inverse FT, determining the intensity distribution, and calculating the moment, using a predetermined deconvolution coefficient that is different than the previous iteration until an optimal deconvolution coefficient is determined based on analysis of the moment. Numerical optimization methods where the deconvolution coefficient is varied are employed until the deconvolution coefficients are optimized or maximized.

Figure 6:
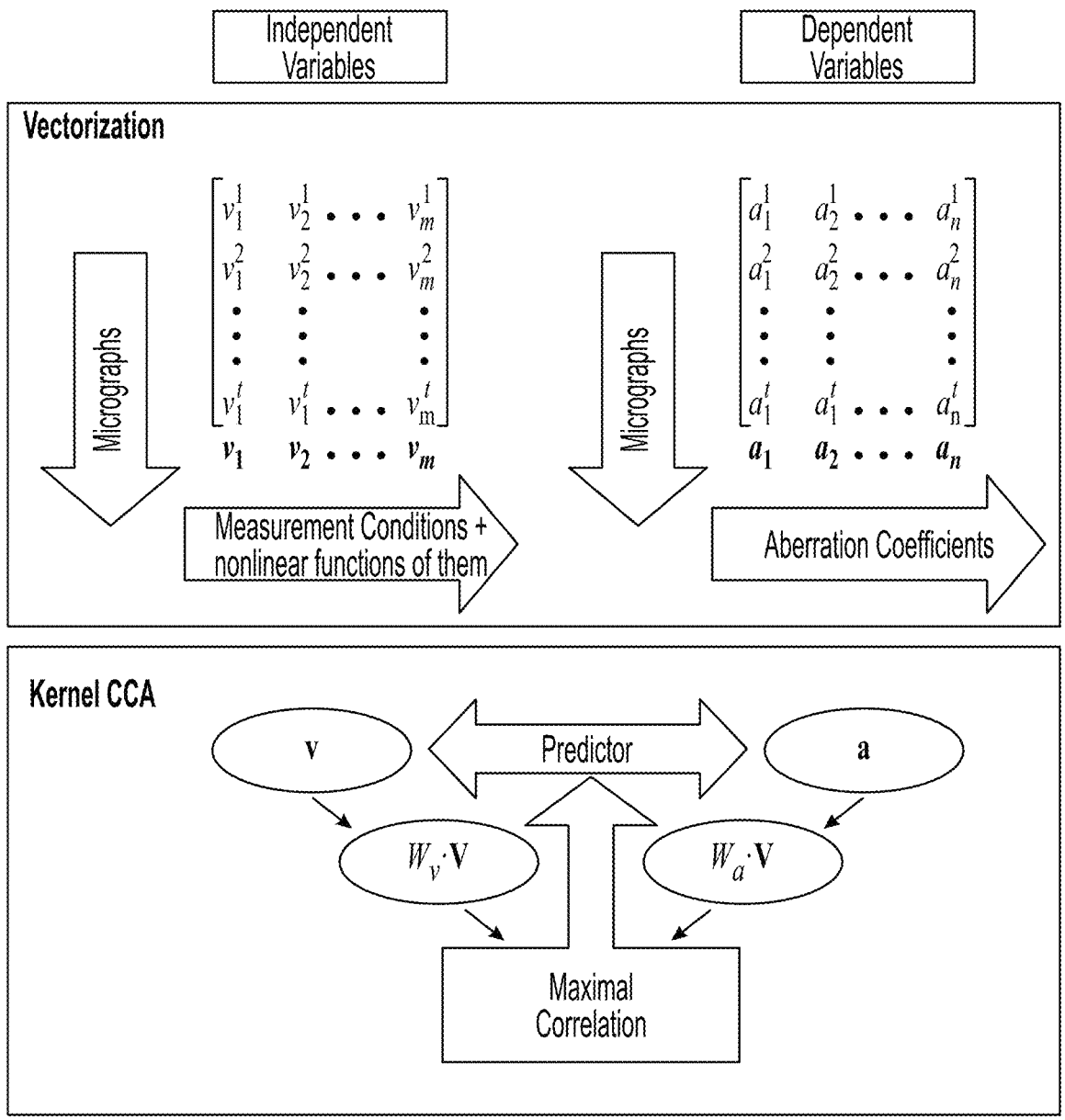
FIG. 6 is a schematic diagram showing the elements of kernel canonical correlation analysis (KCCA) between independent parameters (i.e., observation conditions and their nonlinear functions) and the observed phase shift and geometric distortion aberrations, in accordance with an embodiment of the present inventive concept.

The method may also include determining an aberration correction function that predicts aberrations for every point in the imaged area using kernel canonical correlation analysis (KCCA) of the optimal deconvolution coefficients and the plurality of optical conditions and plurality of coordinated beam-image shifts, as shown in FIG. 6. FIG. 6 is a schematic representation of the KCCA process. In particular, FIG. 6, depicts the elements of KCCA between independent parameters (i.e., observation conditions and their nonlinear functions) and the observed phase shift and geometrical distortion aberrations. The result of the analysis is a function that predicts aberrations for any observation conditions. Additionally, whether conditions for a particular observation are obtained by interpolation or extrapolation of the input data may be defined.

KCCA expands and refines the aberration description such that a complete map is obtained for the area imaged. The parameters (e.g., plurality of optical conditions and coordinated beam-image shifts) of each micrograph are independent variable and they may be used to create one of the matrices used in canonical correlation, as shown in FIG. 6. Various non-linear combinations of these parameters (e.g., $x^2$, $y^2$, xy) may also be used in the matrix. In other words, a feature of KCCA is that not only independent parameter values but also non-linear functions of them may be included. As shown in FIG. 6, a second matrix is formed by the results of the deconvolution coefficient (aberration coefficient) optimization process. In at least some instances, the KCCA may be run hierarchically to correct for a time-variable component of one or more aberrations.

The current calibration determined by the method may be evaluated by collecting data using the beam-image shift method for a specific area using a grid that is not the same as the grid that was used for the calibration. Therefore, the grid may have significantly different properties such as z-height. Therefore, the method may also include obtaining one or more EM images of a calibration check grid sample having one or more known properties that is different than at least one of the one or more known properties of the internal reference grid sample. Then the aberration correction function may be applied to the one or more EM images obtained to produce an aberration corrected EM image. The method may include determining the suitability of the aberration correction function based on comparison of one or more features in the aberration corrected EM image corresponding to one or more known properties of the calibration check grid sample. If the aberration correction function is in the range that only requires interpolation, e.g., within the calibration map generated by the method to this point, no further calibration is required. However, if the aberration correction function is outside the range that that requires only interpolation and extrapolation is required, the foregoing steps of the method may need to be repeated because extrapolations have larger errors than interpolations.

In at least some instances, the method may include further iterative refinement of aberrations. For instance, the initial calibration will determine a time-invariant component of calibration, but instrument hardware may change (drift). In such instances, the initial calibration map may be used and the method repeated by obtaining a plurality of EM images for a smaller image region with a denser network of measurement points or with a different combination of data collection parameters and then repeating the method with these data points but starting from aberration values that are time-invariant. In other instances, the input from the initial calibration may be used to get experiment-specific aberration corrections and then these results may be used in the KCCA.

The image aberrations that may be corrected using the presently disclosed method may be any monochromatic aberrations affecting phase and amplitude of the Fourier transform of the image. For example, the image aberrations that may be corrected using the method may include constant phase offset, image displacement, defocus, twofold astigmatism, axial coma, threefold astigmatism (trefoil), spherical aberration, star aberration, fourfold astigmatism, $5^{th}$-order axial coma, three-lobe aberration, fivefold astigmatism, $6^{th}$-order spherical aberration, $6^{th}$-order star aberration, rosette aberration, and six fold astigmatism. The image aberrations may also be geometrical distortion and curvature of the image field.

According to another aspect of the present disclosure, a method for correcting geometrical distortion in an electron microscopy (EM) image is provided. Geometrical distortion is also known as angular distortion and elliptical distortion. The method involves obtaining calibration of geometrical distortion in the image based on an atomic reference, such as a graphene lattice. The method may include obtaining a plurality of EM images of an internal reference grid sample having one or more known properties, where the plurality of electron microscope images are obtained for a plurality of optical conditions and for a plurality of coordinated beam-image shifts. The plurality of optical conditions may be, for example, a plurality of defocuses, a plurality of z-heights, a plurality of beam tilts, and any combination thereof. The internal reference grid sample may include a crystalline solid support having known unit cell dimensions with an amorphous material distributed over the crystalline support. The amorphous material may have a thickness of five or fewer atomic layers. Preferably, the amorphous material has a thickness of one atomic layer, or one to three atomic layers.

In at least some instances, the amorphous material may be a metal. In such cases, the metal may be any metal that is heavy enough that it may be sputtered onto the surface of the solid support and the layer thickness may be controlled by current and vacuum. In at least some instances, the amorphous material may be, for example, gold, platinum, iridium, palladium, and any combination thereof. These metals are suitable due to their weight and relative inactivity (e.g., do not oxidize). The crystalline support may, for example, be made of graphene, graphene oxide, silicon, or silicon nitride. However, any solid support that generates a diffraction pattern with defined unit cell parameters may be used, especially those materials capable of forming a thin support structure operable to receive an amorphous coating having properties suitable for use as an internal reference grid sample according to the presently disclosed methods.

The method may also include correcting the plurality of EM images for sample drift by aligning and motion-correcting the plurality of EM images to produce an EM micrograph. Then, Fourier transform (FT) of the micrograph is calculated to produce an FT image. The diffraction peaks on the FT image corresponding to the crystalline lattice of the internal reference grid sample are identified and dual space filtering is performed on the FT image by masking the identified diffraction peaks thereby keeping only the diffraction peaks and their corresponding intensities while discarding all information between the diffraction peaks to produce a filtered FT image. An inverse FT of the filtered FT image may then be calculated to produce a filtered EM micrograph.

The preceding steps are performed because in real space the crystalline material such as graphene may consist of overlapping crystal lattices (more than one crystal) or the crystal may be smaller than the imaged area so after FT all the non-crystalline material obscures the data analysis. Therefore, the method finds diffraction peaks in the reciprocal space (Fourier space) and masks them, i.e., keeping only peaks and their intensities while discarding all information between peaks. Then backwards (inverse) FT is calculated to transfer filtered out information from Fourier space to real space. This operation often allows better segmentation of an image in real space. After better segmentation, the FT is calculated again for each segment, i.e., moving back to Fourier space, in order to arrive at "cleaner" diffraction patterns.

Next, unit cell parameters for "cleaner" diffraction patterns are determined using standard indexing procedures. Specifically, the method includes selecting a portion of the filtered EM micrograph and calculating a FT image corresponding to the portion to produce a FT sub-image. Then, a subgroup of diffraction peaks on the FT sub-image is identified and diffraction maxima for the subgroup of diffraction peaks is indexed such that unit cell parameters for the subgroup of diffraction peaks may be determined. A deformation matrix (M) is then determined and used to determine whether the one or more unit cell parameters are consistent with the known unit cell dimensions of the crystalline support of the internal reference grid sample. The deformation (M) matrix contains the description of rotation between the reference lattice and the observed lattice, thus there is no guarantee that the rotation is the same between images. A metric tensor (MM*) is than calculated based on the deformation matrix, by taking the deformation matrix M and multiplying it by its conjugate matrix M*, which is done to eliminate the rotation that is a part of the deformation matrix M. The metric tensor (MM*) does not contain rotation anymore and may be used to perform KCCA.

The method may further include determining an aberration correction function that predicts the geometric distortion for every point in the imaged area using kernel canonical correlation analysis (KCCA) of the metric tensor and the plurality of optical conditions and the plurality of coordinated beam-image shifts, as shown in FIG. 6. The method may further include obtaining one or more EM images of a calibration check grid sample having one or more known properties that is different than at least one of the one or more known properties of the internal reference grid sample and applying the aberration correction function to the one or more EM images produce an aberration corrected EM image. Finally, the method may include determining suitability of the aberration correction function based on comparison of one or more features in the aberration corrected EM image corresponding to one or more known properties of the calibration check grid sample.

Figure 7:
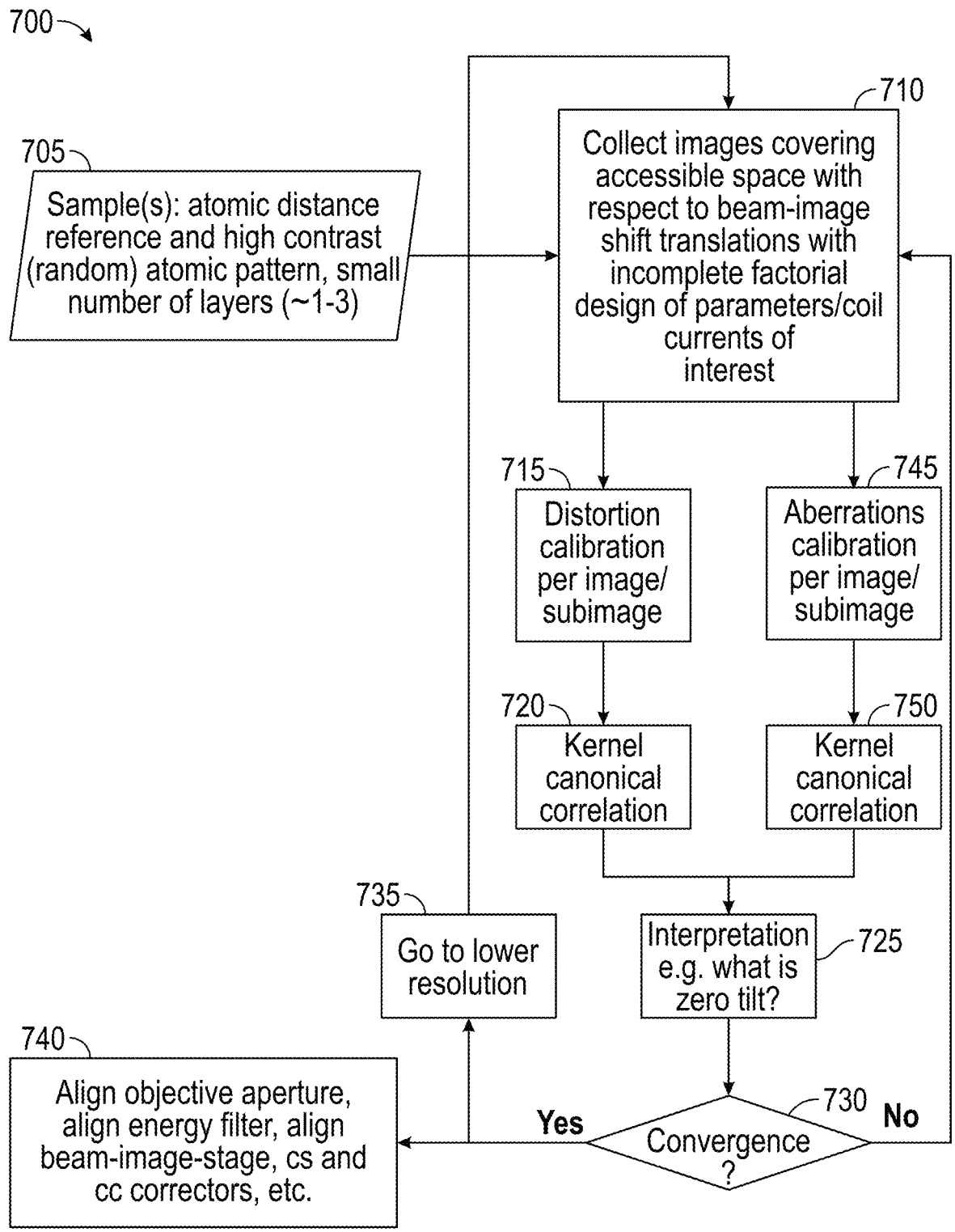
FIG. 7 is a flow-chart depicting a method for correcting one or more image aberrations in an electron microscopy image, in accordance with an embodiment of the present inventive concept.

FIG. 7 depicts an exemplary method 700 for correcting one or more image aberrations in an electron microscopy image, in accordance with an embodiment of the present inventive concept. At 705, an internal reference grid sample having known atomicity and/or unit cell parameters and high contrast atomic pattern is obtained. At 710, a plurality of electron microscope (EM) images of an internal reference grid sample having one or more known properties is obtained for a plurality of optical conditions and for a plurality of coordinated beam-image shifts. At 715, a distortion calibration is determined for each image or subimage in accordance with the methods described herein. At 745, an aberration calibration is determined for each image or sub- image in accordance with the methods described herein. KCCA is performed at 720 using the distortion calibration and at 750 using the aberration calibration. The results of the KCCA analysis are interpreted at 725 and if there is no convergence at 730, the process is repeated beginning with step 710. If there is convergence the process may be repeated at lower resolution 735 beginning with step 710. Alternatively, once convergence is achieved at 730, the results of the KCCA analysis may be used to correct one or more data images and/or used to align the objective aperture, energy filter, and beam-image-stage. The KCCA at 720 and 750 may be performed together or separately, i.e., KCCA can be performed on inputs that contain information from both pathways.

The presently disclosed methods have advantages over the existing power spectrum-based methods for correcting aberrations. In particular, the present disclosure provides novel corrections for aberrations, enabling long-range (tens of microns) electronic repositioning to points intended for data acquisition (i.e., beam-image shift method), including the following innovations: (1) using the beam-image shift method on an unprecedented spatial scale, made possible by computationally reversing the complex image distortions associated with such shifts; and (2) using kernel canonical correlation analysis (KCCA) to identify the parameters needed for reversing image distortions, with distortions measured at multiple positions on the grid and then performing a global fit with KCCA to generate data for corrections for image distortions and to facilitate full alignment of the microscope so that cumbersome alignment procedures can be eliminated.

The presently disclosed methods provide for the precise reversal of complex image amplitude, phase, and geometric distortions created by ultrafast data collection methods relying on imaging a sample away from the optical axis of the microscope. Multiple studies were performed to confirm that such precise distortion maps can be generated and validated for an expected range of experimental conditions. We reanalyzed data previously collected by the beam-image shift method and deposited in the EMPIAR database by calibrating image and phase distortions and then correcting for them. In consequence, we improved the resolution of the proteasome reconstruction from 3.3 Å to 2.4 Å. This change represents an improvement from a mediocre (by today's standards) to a relatively impressive result for data collected on a 200 kV Talus Arctica. For in-house data collected by the team, a high resolution reconstruction was performed on a sample with high (~20 µm) displacement from the optical axis and consequently very high coma distortion. The result also had 2.4 Å resolution from the same type of instrument. Without this computational correction, the result would have a resolution closer to 7 Å.

In one aspect, the presently disclosed methods provide for precise and automated calibration of the EM optics that is required for high throughput, beam-image shift method. In particular, the presently disclosed methods may be use in Cryogenic Electron Microscopy (cryo-EM) which is increasingly used for high-resolution biomolecular structure determination, as shown in FIG. 1. As depicted in FIG. 1, Protein Data Bank (PDB) cumulative statistics showing the growth of X-ray (hatched) and cryo-EM deposits (double-hatched), The growth of cryo-EM deposits resembles the growth of X-ray deposits approximately 25 years ago, indicating that cryo-EM is in an exponential growth phase, represented on logarithmic scale as a straight line.

Figure 2:
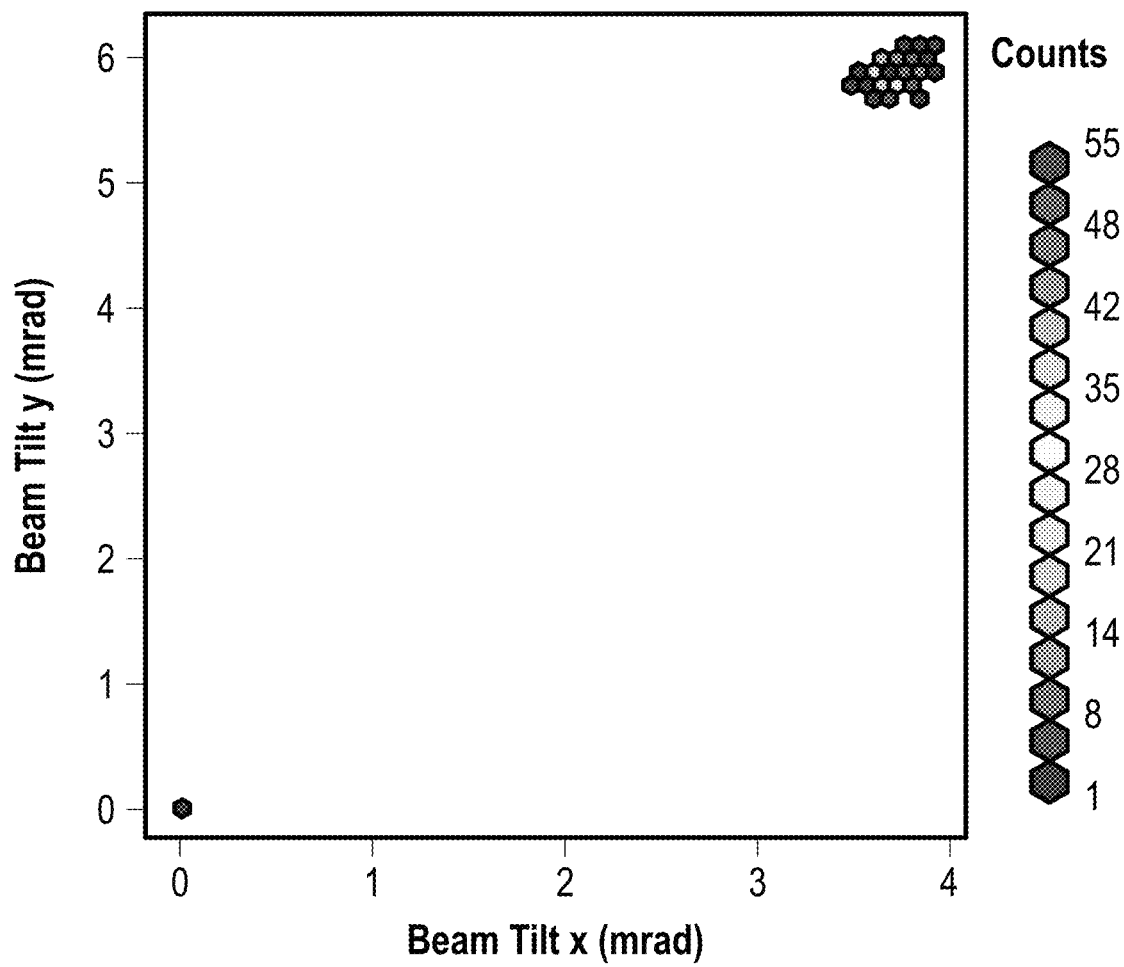
FIG. 2 depicts data showing the precision of beam tilt refinement for 257 micrographs, in accordance with an embodiment of the present inventive concept.

In the bright field (phase contrast) imaging conditions used in cryo-EM single particle reconstruction, image distortions do not result in the loss of information but rather in its rearrangement, which means that the impact of these distortions can be reversed computationally with appropriate procedures. Reversal of some distortions is already an inherent feature of standard cryo-EM software. For instance, cryo-EM data are typically acquired with substantial defocus, and are affected by spherical aberrations and also often some level of astigmatism. These distortions, described by the contrast transfer function (CTF), are reversed during structure reconstruction, We extended this approach to higher order aberration correction functions for reference-based refinement during particle reconstruction, with independent refinement for each micrograph. We found that such aberration refinement of phase shift, defocus, astigmatism, coma, trefoil and anisotropic magnification is very accurate, as shown in FIG. 2, as the results are very reproducible between individual movies when such reproducibility is expected. FIG. 2 depicts data showing the precision of beam tilt refinement for 257 micrographs. As shown for the 257 micrographs used, the precision of the beam tilt refinement is shown by the tight clustering of the independently determined beam tilt values. The optical axis is marked at (0,0).

Figure 3:
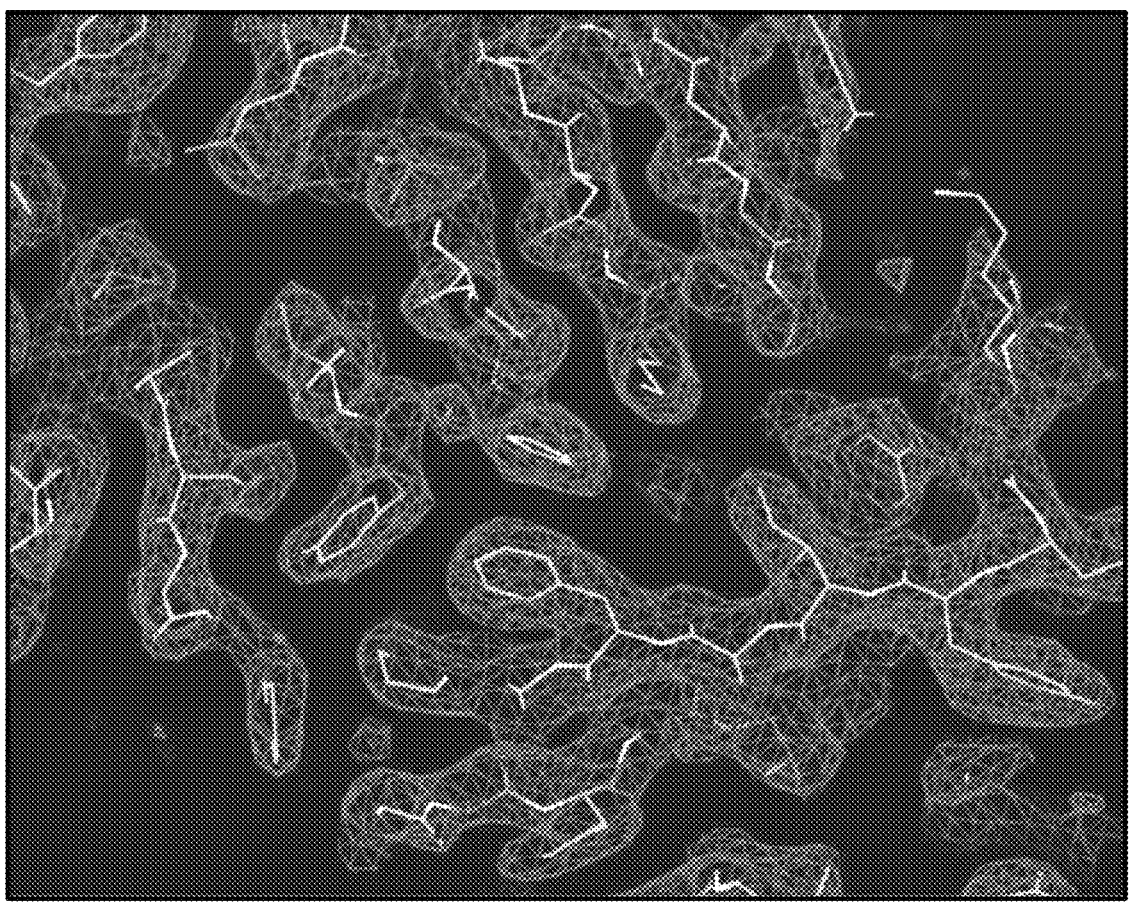
FIG. 3 depicts a region of a 2.43 Å resolution reconstruction where the uncorrected coma aberration resulting from beam tilt was severe enough to limit the resolution to ~7 Å, in accordance with an embodiment of the present inventive concept.

The aberration refinement is also very precise, as for data with huge coma that was caused by a 20 μm shift from the optical axis, we achieved very high resolution (2.4 Å), as shown in FIG. 3, under conditions considered rather challenging for high resolution work, i.e., using Talos Arctica, no phase plate, no energy filter, 200 kV, and with the particles of size 144 kDa. We confirmed that this procedure also works for data deposited in EMPIAR 10186 (7) for proteasome data collected with the beam-image shift method over a smaller range of shifts, using the same type of instrument. This deposit reported a resolution of 3.3 Å, while our phase correction procedure resulted in a resolution of 2.4 Å.

Calibration (global parametrization) maps of distortions present under all experimental conditions encountered may be generated, including initial sample alignment and preview and normal high resolution data collection. The distortion map fully cover the spatial and resolution ranges to be encountered in such steps, including the distance from eucentric height necessary for collecting data with a tilted sample. These calibrations also provide automatically precise position and direction of the optical axis, beam tilt and the focal plane. In an embodiment we use apoferritin as our high quality reference molecule, but other rigid and stable macromolecules can be substituted. We create a unified distortion map by fitting a single global function, for which the optics term is the description of non-axial aberrations. However, for each small imaging area, these non-axial aberrations can be converted into a local axial aberration description, making it easy to interface such global descriptions to existing programs. KCCA is a highly suitable method for this, as it can robustly refine linear and nonlinear relationships between two groups of parameters, one describing explanatory variables, in this case position in real space and in angular (reciprocal) space, and the other describing data features, in this case the magnification and phase distortion, parametrized as a product of real-space and angular-space Zernike polynomials. After we created this distortion calibration, for actual data collection we determine factors that may drift during data collection or between different data collection runs; such drift affects mainly translation (x, y and focus position) and astigmatism. In currently collected data, these are adjusted often, even for each micrograph, although astigmatism drift tends to be slow.

There are different ways to perform correction for image distortion. All corrections can be combined into one operation during reconstruction, as it is in our own three-dimensional reconstruction calculations, but they can also be split into an image manipulation part and the rest into a reconstruction step. As such splitting is the norm when using other programs, we employ computations that correct for the distortions at the image level, so that the results are compatible with existing software. A convenient feature of coma and trefoil distortions is that they can be corrected for at the image level without any loss of accuracy and this extends to performing them multiple times in series, for example an initial correction followed by an additional one during the reference-based refinement. For magnification distortions, such a rule does not hold, but nevertheless the procedure is typically done at the image level, as the information loss is low if the collected data are oversampled. The beam-image shift data collection procedure produces precise results even if applied over large spatial scales and over a large number (up to hundreds) of holes, and robust, automatic calibration of electron optics parameters that can vary between experiments in the same instrument, and so are typically performed for each individual experiment.

According to another aspect of the present disclosure, a method to preview and characterize patterns of quality in the sample, with precise mapping between magnifications, including the magnification used for data collection is provided. The method innovatively includes the splitting of the positioning uncertainty into two components during the preview process: (1) hole indexing and (2) precise detection of the hole edges. The uncertainty split when combined with using the beam-image shift method at data collection magnification enables us to precisely correlate positioning at data collection magnification to the low-magnification preview images, and eliminates the need for the use of intermediate magnifications in current procedures. This has a surprisingly large effect on the quality of data due to the removal of hysteresis and drift associated with the objective lens, generated at every hole-centering step with current protocols using intermediate magnification for this purpose.

The method includes optical distortion mapping and in client-server architecture of experimental control optimized for structural biology experimentalists. In terms of cryo-EM we have collected tens of datasets and reconstructed seven distinct structures, four with resolution better than 3 Å, using a cryo-EM instrument that required full electron beam alignment before data collection. For mapping aberrations and distortions across large areas, we performed KCCA to fit the contrast transfer function (CTF) and geometric distortion patterns on a grid collected by the beam-image shift method. The quality of such a spatial map is defined by how well distortion changes can be predicted from positions. In our early results, we found that the main canonical correlation coefficient of such relationships was 0.994.

The throughput inefficiency in cryo-EM comes also from the long dead-time between collecting micrographs and from the time spent aligning the microscope, evaluating samples and setting up data collection. The results of this method reduce the dead-time between images collected in beam-image shift groups and speed up instrument alignment. In this method we address other bottlenecks resulting from creating preview images, evaluating them, and setting up data collection. Current procedures will not scale for collecting ten thousand or more micrographs per day, and there are a number of steps we take to address this problem.

Many inefficiencies in cryo-EM data acquisition result from poor alignment of preview images in their montages.

These inefficiencies are caused by requirements for an excessive overlap as well as image distortions that inaccurately point to positions at different magnifications, in particular when relating to the magnification desired for data collection. Electron optics have inherent pincushion distortion, which can be parametrized by nonlinear radial displacement relative to the optical axis and in our procedure are established by collecting the same image at different stage positions. The refinement procedure adjusts the distortion to optimize the correlation between images that are shifted by increasingly large amounts. Correcting for pincushion and related higher-order distortions makes images in montages match precisely, reducing the requirement for overlap and therefore the time needed for their collection by a factor of two. These pincushion distortions are stable and so should be part of the instrumental rather than experimental calibration processes.

An additional gain is obtained from reduction of the positional error in the preview montages. Currently, this error results in poor prediction of data collection positions and creates the requirement for an additional, hole covering image at an intermediate magnification to precisely locate the hole. We replace it with a more robust and automatic procedure of relating the square positioning at different resolutions. To precisely align the grid within the square, we use the beam-image shift groups so that we can obtain precise positioning information without the need for applying intermediate magnifications. The penalty of current procedures taking the intermediate resolution image between data collection micrographs is very severe and underappreciated. It involves a large change in currents in the objective lens, which creates changes in the magnetic forces and consequently creates an inelastic, drifting response within the lens, perturbing the position of the image. Such an inelastic response takes substantial time to settle and also creates hysteresis when the cycle is repeated, so the imaging positions and the image distortions change idiosyncratically with such cycles. Therefore, eliminating such cycles is highly beneficial for the stability of the instrument and its calibration, reducing image drift and frequency of recalibrations, and with lower drift improving the quality of the dose-slicing results.

Figure 4:
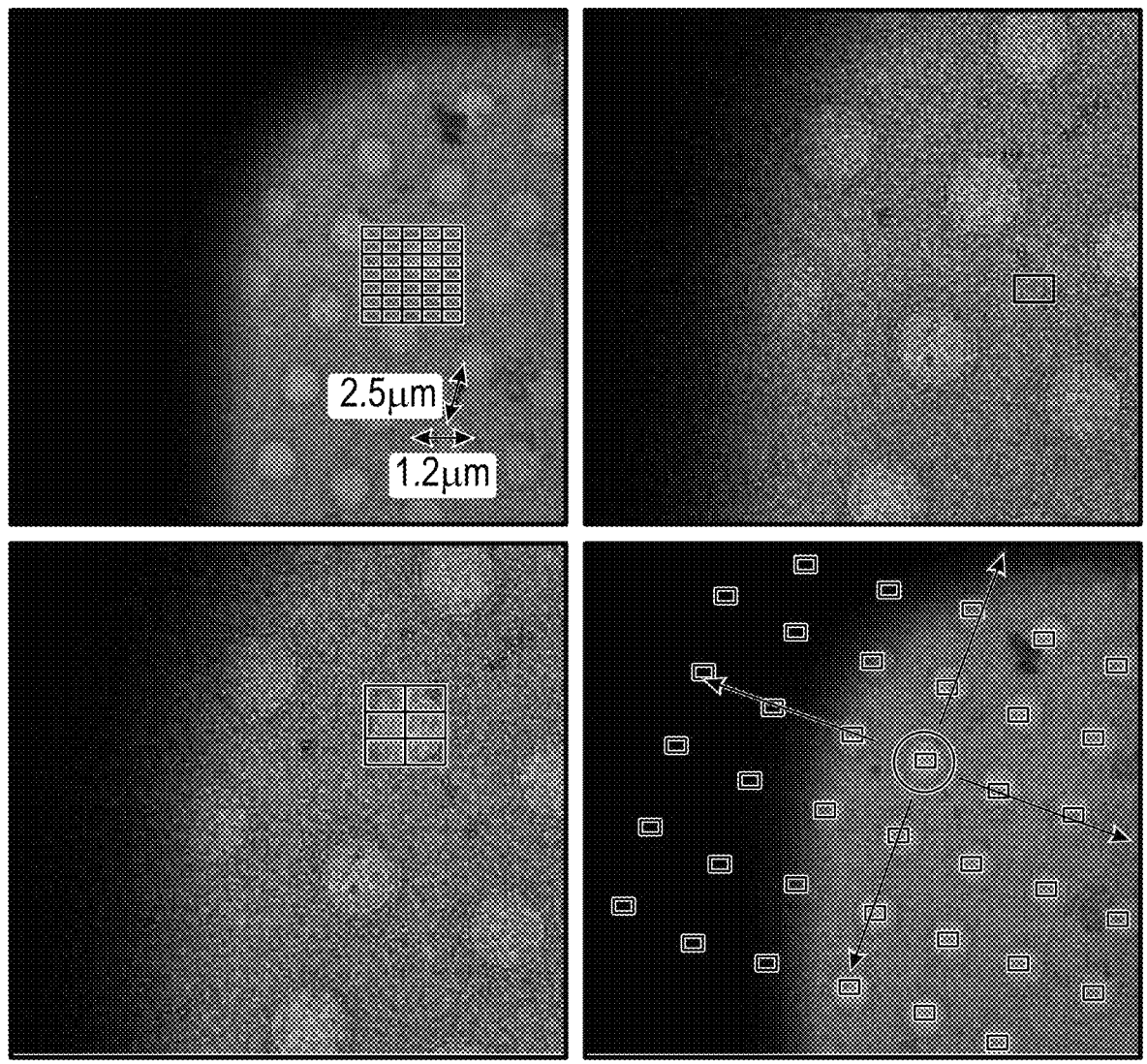
FIG. 4 depicts a multi-step robust navigation between preview images and much higher magnifications used for data collection, in accordance with an embodiment of the present inventive concept.

We eliminate the need for intermediate magnifications by means of a multi-step, fast alignment data collection strategy at higher magnifications, as shown in FIG. 4. First, due to limited field of view, we create very fast montages for finding holes and implement a fast grid-search to robustly establish their indexing. A novel aspect of our navigation is to split the positional uncertainty into (1) precisely locating the hole and (2) defining which hole it is (represented by an index in our procedure). We collect two separate groups of images to resolve these questions separately. This solves the problem of current methods which frequently make positional errors by aligning mis-indexed holes. Recovering from such frequent errors creates the need for additional steps that are cumbersome and even more time-consuming. Our procedure compares ice thickness in two perpendicular rows of holes across different magnifications, thereby resolving indexing ambiguities robustly and requiring minimal time.

Data collection is performed in sessions, where each session represents data acquisition on one or more grid squares. Our procedure uses a constant magnification during the entire session, and so we eliminate objective lens hysteresis contribution to drift. In our early studies, we found drift is smaller in beam-image shift methods. This was confirmed by our analysis of the EMPIAR-deposited proteasome data, resulting from a single sample, but collected with two different protocols.

FIG. 4 depicts a multi-step robust navigation between preview images and much higher magnifications used for data collection, in accordance with an embodiment of the present inventive concept. The steps for establishing precise geometrical relationships between very different resolutions involve first finding a hole in a regular grid (a) and then defining defocus and drift by collecting exposures (blue rectangle in b) from the carbon part (b) or the edge of the hole for gold-on-gold grids. Based on (a) and (b), a smaller subgrid is positioned over the hole to precisely define its boundaries (c) and then indexing ambiguities are resolved by collecting very short exposures (green rectangles in d) with brief settling time to establish the pattern of ice thickness over the nearby grid of holes (d) so that the edge of the rows and columns of visible holes defines unambiguous indexing relative to preview images. The full scheme includes obvious remedial actions such as starting the initial search at different points and considering failure modes at different levels of the instrumental hierarchy, for instance the beam not reaching the detector. Note that the sub-panels have different scales but the rectangles defining exposure and holes have the same size.

Figure 5:
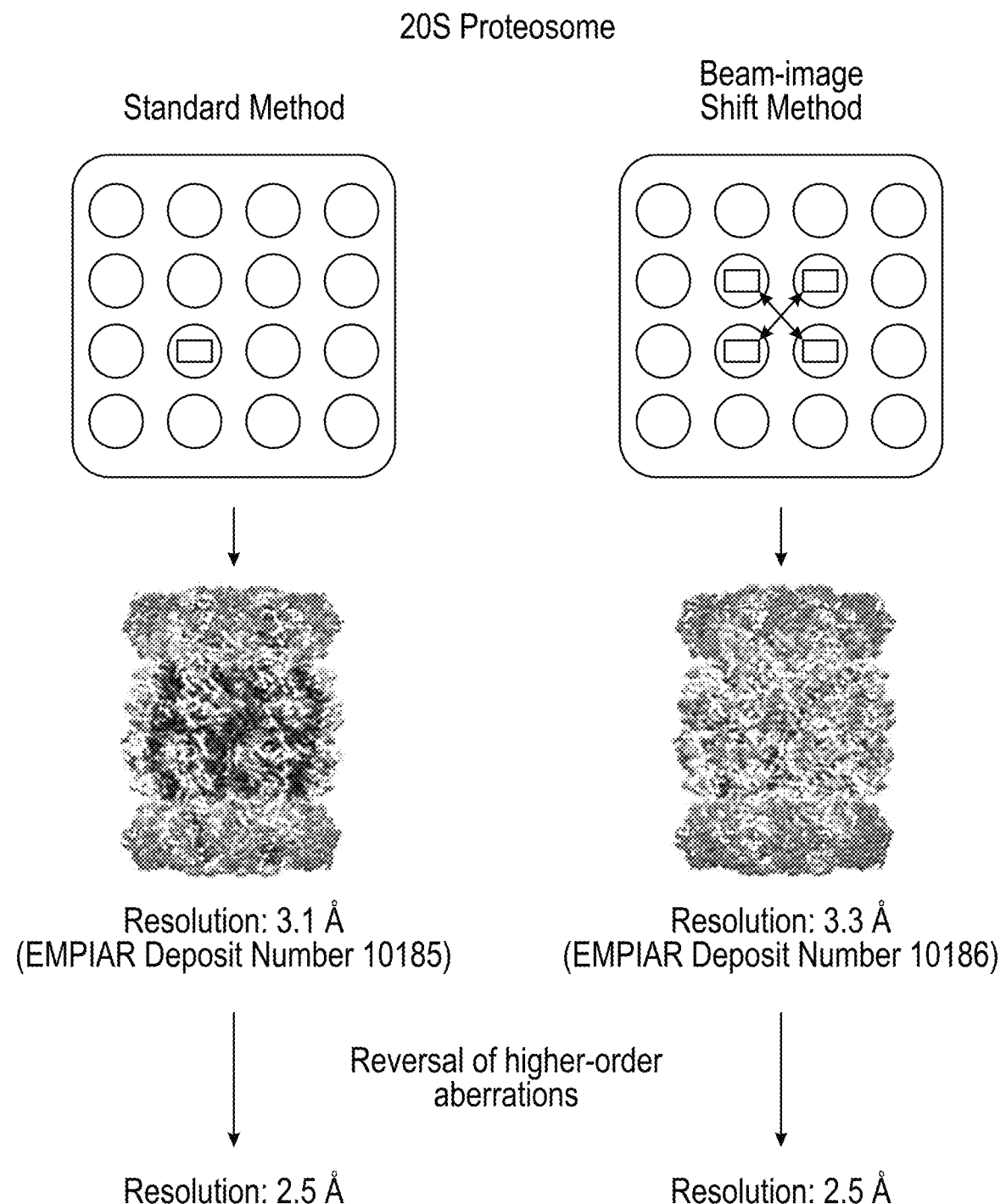
FIG. 5 depicts reanalysis of Electron Microscopy Public Image Archive (EMPIAR) deposits 10185 and 10186 with coma, trefoil, and anisotropic magnification corrections, in accordance with an embodiment of the present inventive concept.

We analyzed a traditionally collected dataset and a limited-range, beam-image shift collected dataset involving two-by-two hole squares. Without distortion correction, the traditionally collected dataset had higher resolution of 3.1 Å relative to the 3.3 Å of the dataset obtained with the beam-image shift method, as shown in FIG. 5. This was reversed after correcting for distortions which resulted in a resolution of 2.5 Å for the traditionally acquired dataset and 2.4 Å resolution for the dataset collected with the beam-image shift method applied over a limited distance. We also implement a novel procedure for monitoring long-term sample drift during an entire session. In a particular beam-image shift group of frames, we estimate drift by recollecting a short exposure of the first position. Then we integrate the drift over multiple groups from the same data collection session. We find relatively high stability for a data acquisition session where only one magnification is used, but our procedures also check for excessive accumulation of drift, which can trigger additional recalibrations.

Our goal is for positional navigation across different magnifications to be precise enough so as to require neither manual intervention, nor the associated time and expertise. For this reason, we identify a number of steps that may seem elaborate but do not need significant time to execute. Additionally, we have built-in checks and corrective procedures to maintain the positional relationships robustly over time.

CTF mapping by global distortion characterization and automatic EM calibration. There are two methods for establishing the defocus or height (z) of a sample point: the contrast transfer function (CTF), which determines the defocus, and the beam tilt method, which is a faster method to define the z. CTF needs high contrast material, more exposure, and is more complicated to analyze; however, it is richer in information, as it can be used to determine multiple phase distortions. The CTF method can also be combined with beam tilting for additional validation of results. We developed a simple but fast and robust (with respect to large astigmatism) CTF estimator to be integrated with the rest of the software.

Calibration starts with verifying that the sample drift is stable so that it can be either ignored or corrected. Then we apply our CTF estimator to data collected over sparsely distributed (~10 to 20) areas on the carbon and for substantially different defocus values (electronically accessible analog of varying the z coordinate). The result from CTF and from translation shifts upon defocus are the input to KCCA which will provide a distortion predictor for any x, y, z triplet in the image. This predictor identifies first the position on the image that is invariant with respect to defocus; this is the position of the optical axis. A major contributor to CTF variations is due to interactions between beam tilt and spherical aberrations. We parametrize beam tilt as having helical twist dependence on the position relative to the optical axis and the beam direction. The fitted value of beam tilt at the optical axis position defines the direction of the optical axis. This provides a main component of our automatic calibration procedure, and defines the coordinate system with respect to the optical axis. This procedure can determine the aberrations affecting CTF and by means of interactions with spherical aberration can also determine beam tilt and consequently coma. However, it cannot determine aberrations like trefoil and others having higher-order terms. Outside of the optical axis, we identified significant trefoil in one of our datasets and also in the proteasome EMPIAR deposits 10185 and 10186. We identify the dependence of such distortions on the distance from the optical axis by reference-based refinement of high quality samples like apoferritin. Because they originate from the shape effects of the objective lens, they are quite stable even over long periods of time. Therefore, the pattern of these aberrations should be considered as being part of the instrument calibration rather than being specific to the experiment. While imaging the carbon provides the fastest means to establish the mapping of distortions, analysis of CTF determined from data collection can also be used to find the global distortion map and its potential drift. Additional controls can be obtained by collecting more data with beam tilt to differentiate defocus variations resulting from non-perpendicularity and non-planarity of the sample from imaging lens distortions.

The results of this method includes a time-efficient procedure of collecting preview images and precise navigation between magnifications. This allows for collecting quickly and exactly at the desired positions and defocus. The procedure allows for one data collection session to completely avoid the destabilizing effects of changing the magnification of the microscope, and so greatly reduces the time needed for image stabilization. The precision of the data collection benefits faster convergence of downstream procedures and results in more efficient feedback calculations for monitoring data collection and readjusting it to the needs of the experiment.

Features of the presently disclosed methods include: analysis of higher-order axial aberrations and not just the five "standard" Seidel aberrations; analysis of non-axial (i.e. both reflection angle- and image position-dependent) aberrations; the analysis of non-axial aberrations is performed by: (1) globally refining parameters of functions describing aberrations for the entire imaging field that covers many potential micrographs; (2) propagating parameters refined for the entire imagining field to each separate micrograph and converting the description of non-axial aberrations to the description using axial aberrations locally; (3) allowing for similar conversion to be applied separately to images of single particles, which facilitates the use of non-parallel illumination without deteriorating the quality of the final reconstruction.

Other features of the presently disclosed methods include: refinement of complex non-axial aberrations with kernel canonical correlation methods (this includes anisotropic magnification distortion); refinement of aberrations by optimizing skewness or related statistics of signals from a high contrast source image to guide the instrument calibration; calibration using direct electron detectors without the need to switch to a separate camera during calibration because there is no need to focus the beam (image processing is used to align the condenser without the need to focus the beam); identifying unstable components of aberrations and refining them more frequently during data collection series (per movie, per group of movies, to correct the alignment); mapping non-axial and axial aberrations and also image rotation at substantial defocus values to allow for precise mapping between survey mode and data collection mode; relative to the current methodology, using large combined beam and image shift to rapidly change the part of the sample being observed, which allows for a many-fold improvement in data collection throughput in SPA applications; using beam-image shifts also to survey or preview part of the data collection, including an option to perform surveys at high magnification and at high speed; three-dimensional montage of the grid by efficient, limited-sampling based tomography (using sample tilt to characterize the three-dimensional properties in preparation for data collection; our maps are three-dimensional maps and consider defocus); data collection with beam tilt to achieve collection in high throughput mode: 20+ structural information (up to +1-2-3 degrees which will guide hierarchical classification); 20+ sub-tomograms to speed up full range tomography; precession data in dark mode from crystals and with a circular aperture The present disclosure provides a new approach to calibration of EM instruments. The current manual or semi-automated calibrations rely on analyzing modulation of the signal in Fourier Transform space and the shape of the objective aperture image. Such a traditional approach to calibration generates problems. First, it only identifies a subset of aberrations. Specifically, it has not been developed to characterize non-axial aberrations. In addition, calibration of odd order aberrations, such as coma, relies on indirect correlates of features of aberrations, and therefore it is imprecise and easily mis-applied. Second, this traditional procedure requires focusing of a source beam on the detector. A highly focused beam negatively affects high performance direct electron detectors, and so the procedure requires a separate detector to be attached to the microscope.

In contrast, the presently disclosed methods rely on analyzing higher order moments (e.g. skewness, entropy or related ones) of image intensity calculated on contrast transfer function (CTF)-corrected images acquired with highly precise and sensitive detectors, and so it determines aberrations more directly without being subject to the limitations of the present technology. Our novel approach also uses a global description of non-axial aberrations through the use of kernel canonical correlation analysis to calibrate them. A second novel aspect is using non-simplified (fully described) aberrations during data collection and reversing their impact by applying software corrections during subsequent data analysis; this allows for a large improvement in throughput of data collection in cryo-EM, without negatively affecting data quality. Another innovation is our use of higher order aberrations in cryo-EM, allowing us to improve resolution and also enabling data collection mode where we tilt the beam. None of the current data collection methods outside of diffraction measurements uses variable beam tilt for data collection. Tilting the beam speeds up tomography, makes it possible to perform very fast, limited angular range tomography, and allows for a novel type of imaging experiments involving crystals.

The present disclosure provides more detailed (higher resolution) structural models; this benefit depends on the level of uncorrected aberrations, which is highly variable between experiments. More skilled experimenters, who can align microscopes better, have lower levels of aberrations in their experimental data. Typical current results in the field have marginally acceptable resolution, so improving resolution even moderately is of very high importance. Data collection with beam tilt allows for new experimental modalities. These modalities address scientific and industrial problems, such as absolute configuration determination of a chemical which does not create macroscopic (multiple microns) crystals. Improving resolution is one of the most critical aspects of cryo-EM experiments. Optimization of resolution of the cryo-EM model can take months or years in individual experimental projects. Our approach removes one of the unknown unknowns, which is the state of the instrument alignment during data collection, as current software does not provide any signature of the presence of many types of misalignment. Part of the current problem is that validation of the alignment is not preserved in any experimental records in standard protocols.

The presently disclosed methods enable less expensive instruments, e.g. Talos Arctica and Glacios, produce almost the same results in terms of throughput and quality as the results generated by much more expensive instruments, e.g. Krios. This can be achieved by accepting non-parallel beam illumination, which current data analysis software does not handle; Krios can adjust the illuminated area in parallel mode, while the less expensive instruments create a converging beam when reducing the illuminated area on a sample. The cost difference between these instruments is in the millions of dollars where the other factors contributing to the difference are of smaller significance in practice.

The calibration step used in the presently disclosed methods has important novelty in terms of its use of maximum entropy related methods combined with an experimental setup suitable for the approach. It is also novel and innovative in its use of atomic grids for correction of non-axial distortion. One can also use a studied sample in the calibration, which is particularly useful to follow variations in aberrations and correct for these variable aberrations, although the studied sample can also provide other calibration information. The global (non-axial) analysis of variations can also be done with less efficient methods than kernel (non-linear) canonical correlation; however, kernel canonical correlation is more efficient than other methods because it can rely on a relatively low number of observations/calibration data points to recover a sufficiently accurate (reasonable) predictor.

Graphene or a graphene oxide layer(s) serve multiple purposes, including providing transparent and stable support for heavy atoms that create high contrast, and the crystalline periodicity serves as a distance scale and angular distortion (technical term is elliptical distortion, with the meaning derived from observing a distorted circle) marker at high magnifications. The strong heavy atom features, once calibrated with respect to their relative distances at high magnification, can serve as distance features for magnification and distortion calibration at multiple lower magnifications. At high resolutions, distortions can be considered as linear within the image, and if they are anisotropic, they are sometimes referred to as elliptical distortions. At lower resolutions, non-linear descriptions can be used to describe their positional dependence in the image. At high resolutions, the positional dependence within the image may not be observable, but we found that if we applied the beam-image shift method, then the magnification and elliptical distortions do change with the changing position within the microscope, but only for shifts which are much larger than the size of the observed image. To observe a crystalline lattice, one can perform a defocus scan so that the periodic lattice will not fall on one of the zeroes of the contrast transfer function (CTF). Observing crystalline periodicity of light atoms (carbon, silicon, etc.) is preferentially performed at a real pixel size of 1 Å or smaller. Real pixel size refers to physical pixels of the detector, which can be different from data pixel size. Data pixel size can be smaller due to interpolation/super-resolution methods.

A next step of calibration involves determination of CTF but treated as the complex quantity. Depending on the situation, e.g. microscope, the design of calibration conditions in the image and beam-tilt-shift space may follow incomplete or complete factorial design. For each image position, beam tilt etc. — the CTF of the image is analyzed—with Laguerre-Gauss functions providing real component and analysis of higher moments of images similarly to Independent Component Analysis (skewness, kurtosis, maximum entropy) provide the phase shift component of CTF (imaginary part). All aberrations obtained by this procedure are local axial aberrations.

The values obtained from calibration enter the kernel canonical correlation analysis (KCCA). This method allows for the recovery of the non-linear dependence between all parameters (aberrations) in the form of a function—so it provides recovery of very accurate values of local axial aberrations. The function (predictor) can be in turn used to calculate the values of aberrations in all points of image space, even those that are not calibrated (calibration is typically sparse).

The design of electron optics inherently induces complex non-axial aberrations over the possible range of beam-image shifts. These aberrations are a consequence of the geometry of electron optics, which are mostly defined at the manufacturing and microscope assembly steps, although some smaller variations do occur. For this reason, calibration will have a large component which is stable over time, combined with smaller changes that occur between data collection and during data collection, with larger changes occurring after mechanical realignment of microscope components. Combining calibration with analysis (supra) can provide a priori map (calibration) of non-axial aberrations for a given instrument, wherein the calibration will have time-stable and time-variable components. Astigmatism has been observed to be particularly variable, even during a single data collection run, while some complex aberrations like spherical aberrations or trefoil are expected to be rather stable. Repeating full calibration with KCCA with an additional explanatory variable that involves time identifies stable and unstable components.

The present disclosure provides the following aberration corrections, among others: (1) enables automatic alignment of microscopes used in cryo-EM for both stable and time-dependent (dynamic) components—this is useful and important in practice and can also be applied in non-cryo-EM, high resolution applications; (2) enables high-throughput cryo-EM data collection because non-axial aberrations, due to large beam-image shifts, can be corrected (the beam-image shift method is used but not at the scale of beam shifts that our method can correct for). The data collection method may involve intentionally coupled beam tilt to compensate for the beam tilt effect induced by beam shift (this is known), which is particularly important when using a phase plate; (3) enables continuous data collection from multiple positions (holes)—continuous in terms of creating very long movies containing many frames, with one movie corresponding to several micrographs with the split performed by the software after data collection. Existing delays in data collection are related not only to mechanical movement of the stage in a microscope but also to starting and stopping data acquisition from the detector. The current standard is one micrograph per movie, but at the cost of detector setup time, e.g. 3 seconds for Falcon3. Collecting a continuous movie from multiple micrographs reduces the impact of these delays, but these delays become more important only if other delays have been reduced (e.g. from repositioning the sample, which our methods reduce by a substantial factor). Single micrograph exposure can be done in low single seconds, so avoiding detector setup time is important; (4) enables much better use of the phase-plate, particularly when used with the beam-image shift method. Aspects of this include: a) we precisely hit the desired point on the phase-plate, and b) we use a novel and nonobvious strategy of repositioning the phase-plate. This novel strategy has multiple important benefits, including stable and optimal phase shift across the experimental data, and efficient use of the phase plate, which enables high-throughput modes; (5) enables fast tomography by using a mix of the stage tilt and the beam tilt, a method which is faster and more precise than the current method which relies on stage tilt only; (6) enables data collection in imaging-mode from crystals, with adjustments to data collection and analysis; (7) enables acquiring additional experimental information to improve high-resolution reconstruction of structures, particularly for macromolecules in the lower size end of cryo-EM applicability (e.g. smaller than 200 kDa). This aspect of the present disclosure is related to defocus, which while being an aberration is used intentionally to increase contrast in the absence of a phase plate. The precise value of defocus affects high resolution reconstruction, with high resolution reconstruction being considered highly valuable. Defocus is defined as the distance in the z direction (the beam direction) of a particle's center of mass from the focus point of the optics. For large molecules (significantly larger than 200 kDa), defocus can be determined by direct reference-based refinement of each particle separately. This is not possible to achieve for smaller particles due to insufficient signal to noise, where instead the signal from multiple particles is used to estimate their z height, with an obvious problem if the z height varies between particles, for example due to particles being positioned at different z height in the ice layer and also possibly due to tilt and curvature of this layer. The consequences of this z determination inaccuracy could be avoided if we had a different method to determine the z height, and our methods are relevant here because it provides for such a method. Comparing images at different tilts allows for z height determination of individual particles with higher accuracy than analyzing defocus. In fact, this is well known in the field of optics as the phase detection method, used for example in photographic cameras, with obvious technical adjustments due to the difference between electron and visible optics. Experimental data collection would need to be adjusted to collect multiple beam tilts (variable beam direction) in a movie or multiple movies. Current instruments are perfectly capable of such an adjustment, and this is also not complex from a software perspective In an aspect, the present disclosure provides a method for correcting non-axial aberrations in electron microscopy, comprising the steps: performing kernel canonical correlation analysis (KCCA) with input data from a prior calibration of the microscopy to recover a global description of non-axial aberrations (predictor), i.e. a description of aberrations at every point of the optical system. The method further comprises the antecedent step: calibrating an electron microscope with a grid covered with graphene/graphene oxide and sparsely sputtered with a radiation-resistant material such as gold, platinum or iridium that provides a method-compatible signal and method-compatible computational behavior (e.g. known sizes of atoms, clusters, diffraction maxima, etc.), wherein calibration data is collected at multiple but not all points of the optical system (e.g. on the order of hundreds) selected to cover the area that will be used in the beam-image shift method or during tilting.

The method further comprises the step of applying the predictor to obtain patterns of aberrations in any position away from the optical axis and eucentric height to navigate (though calibrating the whole available z height range is not always required to practice the presently disclosed techniques) image space at distances far from optical axis without impact of aberrations on data quality.

The presently disclosed methods may be applied to beam-image shift methods and/or automatic calibration of TEM microscopes. The presently disclosed methods may be applied to the use of the phase plate, including correction for its peculiar aberrations and continuous advancement between micrographs during a data collection session (we do not advance it during one micrograph but we make very small advances between micrographs).

The KCCA may be run hierarchically i.e. first to get a time-invariant description of the instrument and then later each time when data are collected to correct for time-variable component of aberrations. In an aspect, the present disclosure provides a method for correcting non-axial aberrations comprising steps: calibration with a grid covered with graphene/graphene oxide and sparsely sputtered with a radiation-resistant material such as gold, platinum or iridium that provides a method-compatible signal and method-compatible computational behavior (e.g. known sizes of atoms, dusters, diffraction maxima, etc.), wherein calibration data is collected at multiple but not all points of the optical system (e.g. on the order of hundreds) selected to cover the area that will be used in the beam-image shift method, including focus adjustments due to different z heights of a tilted sample (we typically calibrate aberrations for z distance range arising from image shift of a tilted sample but this is much smaller than the available z distance range); and perform KCCA (kernel canonical correlation analysis) with the input data from the calibration step, wherein this operation provides a description of aberrations at every point of the optical system.

The calibration can be used to characterize every cryo-EM instrument. In practice, full calibration will typically be performed rarely, such as when an instrument is purchased, moved, or some other potentially calibration-disruptive change occurs, however, it may also be performed at other time-points, as part of a regular or irregular calibration schedule, or anytime to assuring that the instrument is working properly.

KCCA provides, based on the input from calibration in (a), a formula specific to an instrument on which calibration was done which allows for the determination of optical aberrations at each point of the optical system that we decide to use, but KCCA also accounts for separating time-constant aberrations, e.g. trefoil, from those that change with time. So, data collected during normal experiments (not calibration) can be used as the input to KCCA as well to determine these time-variable changes as departures from the values determined during calibration.

KCCA uses input numbers obtained from single micrograph calibrations to determine a time-invariant and time-dependent microscope description for beam-image shift method. The calibration can be performed differently than exemplified here, but should have a combination of features that are currently not appreciated/not needed for standard calibrations, such as a mix of two materials providing atomic features/diffraction from a defined lattice. Standard calibrations at atomic scale are not done to characterize higher order aberrations present for the full range of the beam-image shift method.

KCCA can be run on calibration data collected differently. Conversely, the points collected with our calibration procedure can be used by other, and potentially slower and less accurate approaches than KCCA, and still produce a potentially useful global predictor. The KCCA is run iteratively, i.e. first on the calibration data to get time-invariant description of microscope (this is done rarely) and then again during every experiment on "normal" samples to correct time-changing component of calibration (this is done frequently). The outputs from calibration and KCCA enable larger shifts for the beam-image shift method, i.e. much faster data collection, automatic microscope calibration, etc. The presently disclosed methods include all combinations of recited particular embodiments as if each combination had been laboriously recited.

What is claimed is:

1. A method to correct one or more image aberrations in an electron microscopy image, the method comprising:
   obtaining a plurality of electron microscope (EM) images of an internal reference grid sample, the plurality of EM images captured using an electron microscope in connection with a plurality of optical conditions including a plurality of coordinated beam-image shifts;
   generating an EM micrograph by correcting the plurality of EM images for sample drift;
   generating a deconvolved image by deconvolving a transformed image using one or more deconvolution coefficients, the transformed image generated by applying a transform to the EM micrograph;
   generating a filtered deconvolved image by applying a filter to the deconvolved image;
   generating an aberration-corrected EM micrograph by calculating an inverse transform of the filtered deconvolved image;
   determining an intensity distribution for the aberration-corrected EM micrograph;
   calculating a moment for the intensity distribution; and
   performing an iterative optimization process using one or more deconvolution coefficients until an optimal one or more of the one or more deconvolution coefficients is determined based on maximization of the moment.

2. The method of claim 1, further comprising:
   determining an aberration correction function operable to predict aberrations using a kernel canonical correlation analysis of the optimal one or more of the one or more deconvolution coefficients and the plurality of optical conditions.

3. The method of claim 2, further comprising:
   obtaining one or more EM images of a calibration check grid sample having one or more known properties that is different than at least one known property of the internal reference grid sample; and
   generating an aberration corrected EM image by applying the aberration correction function to the one or more EM images.

4. The method of claim 3, further comprising:
   comparing one or more features in the aberration corrected EM image to one or more known properties of the calibration check grid sample to determine whether the aberration correction function is suitable.

5. The method of claim 4,
   wherein,
   the aberration correction function is determined to be suitable when the aberration correction function is within a range, and
   the aberration correction function is determined to not be suitable when the aberration correction function is outside the range.

6. The method of claim 1,
   wherein,
   the iterative optimization process includes selecting the one or more deconvolution coefficients from a range of deconvolution coefficients values that is different than a previous iteration of the iterative optimization process.

7. The method of claim 1,
   wherein,
   the iterative optimization process includes repeating at least the calculating of the inverse transform until the optimal one or more of the one or more deconvolution coefficients is determined based on maximization of the moment.

8. The method of claim 1,
   wherein,
   the generating of the EM micrograph includes aligning and motion-correcting the plurality of EM images.

9. The method of claim 1,
   wherein,
   the filter is a high-pass filter, and
   the filtered deconvolved image is generated by applying the high-pass filter to the deconvolved image.

10. The method of claim 1,
    wherein,
    the plurality of optical conditions is selected from a plurality of defocuses, a plurality of z-heights, a plurality of beam tilts, a plurality of beam parallelizations, and any combination thereof.

11. The method of claim 1,
    wherein,
    the transform is a Fourier transform, and
    the transformed image is generated by applying the Fourier transform to the EM micrograph.

12. The method of claim 1,
    wherein,
    the internal reference grid sample includes an amorphous material distributed over a support, and
    the amorphous material has an atomic mass heavier than a material comprising the support.

13. The method of claim 1, wherein the calculating of the moment includes quantifying a shape of the intensity distribution based on a function suitable for optimization with independent component analysis.

14. The method of claim 13,
    wherein,
    the function is selected from a group, and
    the group includes negative entropy, skewness, and kurtosis.

15. The method of claim 1, wherein the calculating of the moment includes quantifying a shape of the intensity distribution based on optimizing negative entropy.

\* \* \* \* \*